United States Patent
Park et al.

(10) Patent No.: US 6,893,915 B2
(45) Date of Patent: May 17, 2005

(54) SEMICONDUCTOR DEVICE HAVING BARRIER LAYER BETWEEN RUTHENIUM LAYER AND METAL LAYER AND METHOD FOR MANUFACTURING THE SAME

(75) Inventors: Hee-sook Park, Seoul (KR); Gil-heyun Choi, Sungnam (KR); Seung-hwan Lee, Seoul (KR); Yun-jung Lee, Seoul (KR)

(73) Assignee: Samsung Electronics, Co., LTD, Suwon (KR)

( * ) Notice: Subject to any disclaimer, the term of this patent is extended or adjusted under 35 U.S.C. 154(b) by 0 days.

(21) Appl. No.: 10/127,651

(22) Filed: Apr. 22, 2002

(65) Prior Publication Data

US 2003/0060042 A1 Mar. 27, 2003

(30) Foreign Application Priority Data

Sep. 21, 2001 (KR) ........................................ 2001-58557

(51) Int. Cl.$^7$ ......................................... H01L 21/8242
(52) U.S. Cl. ........................ 438/253; 438/643; 438/650
(58) Field of Search .................... 438/3, 238, 253–256, 438/381, 396–399, 626–629, 642–650, 686, 240

(56) References Cited

U.S. PATENT DOCUMENTS

| | | | |
|---|---|---|---|
| 5,005,102 A | * | 4/1991 | Larson ........................ 361/313 |
| 5,672,385 A | * | 9/1997 | Jimba et al. ............. 427/248.1 |
| 6,121,149 A | * | 9/2000 | Lukanc et al. .............. 438/692 |
| 6,278,150 B1 | * | 8/2001 | Okudaira et al. ........... 257/306 |
| 6,515,843 B2 | * | 2/2003 | Nakabayashi et al. ...... 361/305 |
| 2003/0059980 A1 | * | 3/2003 | Chen et al. .................. 438/118 |

FOREIGN PATENT DOCUMENTS

| KR | 006108 | 1/1999 |
|---|---|---|
| KR | 007103 | 1/1999 |

OTHER PUBLICATIONS

Wolf, pp. 121–127, vol. 2, Silicon Process for the VLSI era, 1990, Lattice Press.*
English Abstract.

* cited by examiner

Primary Examiner—H. Jey Tsai
(74) Attorney, Agent, or Firm—F. Chau & Associates, LLC

(57) ABSTRACT

A method for fabricating a semiconductor device is provided. A ruthenium layer is formed on a semiconductor substrate in a processing chamber. A barrier layer is formed on the ruthenium layer supplying a halide-free precursor in the processing chamber. A metal layer such as an aluminum layer, an aluminum alloy layer, a tungsten layer, or a copper layer is formed on the barrier layer. The barrier layer is one of a TiN layer, a TaN layer, a WN layer, and an MoN layer. The TiN layer is one of formed by using an MOCVD process and an ALD process, and the halide-free precursor is a titanium compound selected from the group consisting of pentakis(diethylamino) titanium, tetrakis(diethylamino) titanium, tetrakis(dimethylamino)titanium, and pentakis (dimethylamino)titanium. The TaN layer is formed by using one of an MOCVD process and an ALD process, and the halide-free precursor is a tantalum compound selected from the group consisting of t-butyltrikis(diethylamino)tantalum, pentakis(diethylamino)tantalum, tetrakis(dimethylamino) tantalum, and pentakis(dimethylamino)tantalum.

20 Claims, 8 Drawing Sheets

ID# SEMICONDUCTOR DEVICE HAVING BARRIER LAYER BETWEEN RUTHENIUM LAYER AND METAL LAYER AND METHOD FOR MANUFACTURING THE SAME

BACKGROUND OF THE INVENTION

1. Field of the Invention

The present invention relates to a semiconductor device and a method for manufacturing the same, and more particularly, a semiconductor device having a barrier layer between a ruthenium layer and a metal layer and a method for manufacturing the same.

2. Description of the Related Art

Semiconductor memory devices generally include a plurality of conducting layers and a plurality of dielectric layers between the plurality of conducting layers. Among the plurality of the conducting layers, operatively related conducting layers are connected to each other. Generally, a bonding layer and a barrier layer are formed between a lower conducting layer and an upper conducting layer to prevent deterioration by physical and electrical differences between conducting layers such as separation and diffusion of impurities. The bonding layer and the barrier layer are typically formed between a silicon substrate and a bit line contact plug (e.g., a tungsten plug), between a silicon substrate and a storage electrode contact plug (e.g., a tungsten plug), between the tungsten plug and an aluminum line for a bit line, between the tungsten plug and a polysilicon layer for a lower electrode of an MIS (Metal-Insulator-Silicon) capacitor, between the tungsten plug and a metal layer for a lower electrode of an MIM (Metal-Insulator-Metal) capacitor, or between a metal layer for an upper layer of a capacitor and a metal layer for wire such as aluminum.

Ti/TiN layers are used as the bonding layer and the barrier layer between a tungsten layer and a polysilicon layer and between a tungsten layer and an aluminum layer. If a wire layer is formed of copper, the bonding layer and the barrier layer are Ta/TaN instead of Ti/TiN.

The barrier layer can be formed by using one of a physical vapor deposition (PVD) process and a chemical vapor deposition (CVD) process. As semiconductor memory devices are more integrated, the CVD process is more preferably used for securing step coverage. However, if the bonding layer and the barrier layer are formed on a ruthenium layer, surface characteristics between the ruthenium layer and the bonding layer or the barrier layer are poor.

FIG. 1 is a flow chart of a conventional process for forming a barrier layer between a ruthenium layer and a metal layer. Referring to FIG. 1, a ruthenium layer is formed on a semiconductor substrate by using a CVD process in a CVD chamber [S1]. Next, $TiCl_4$ (gas state) and $NH_3$ gas are fed to the CVD chamber including the semiconductor substrate having the ruthenium layer, a barrier layer such as a TiN layer is formed by a following reaction [S2] at a temperature of about 600° C.:

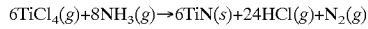

$$6TiCl_4(g)+8NH_3(g)\rightarrow 6TiN(s)+24HCl(g)+N_2(g)$$

And a metal layer for a wire on the barrier layer of TiN [S3] is formed.

However, with the CVD chamber being at a high temperature at or about 600° C., the $TiCl_4$ (gas state) reacts with not only the $NH_3$ gas, but also the ruthenium layer, thereby forming ruthenium halide such as $RuCl_3$(g) or $RuCl_3*H_2O$ salt. The ruthenium halide $RuCl_3$(g) separates the ruthenium layer from the TiN layer by out-gassing and the $RuCl_3*H_2O$ salt acts as an insulating material disposed between the ruthenium layer and the TiN layer, thereby deteriorating electrical conductivity characteristics between the ruthenium layer and the TiN layer.

FIG. 2 shows a scanning electron microphotograph (SEM) view of cross-section of a conventional structure having a barrier layer between a ruthenium layer and a metal layer. As shown in FIG. 2, the ruthenium layer is separated from the barrier of the TiN layer. It is generally caused by a halide containing matter such as $TiCl_4$ for forming the TiN layer.

In semiconductor devices which are more highly integrated, a noble metal layer such as a ruthenium layer is used as an upper electrode of a capacitor. During forming the bonding layer/barrier layer such as with Ti/TiN or Ta/TaN on the ruthenium layer, ruthenium halide such as $RuCl_3$(g) or $RuCl_3*H_2O$ salt can be formed. Accordingly, a metal layer formed on the capacitor upper electrode is separated from the upper electrode or a ruthenium salt is generated between the capacitor upper electrode and the metal layer, thereby increasing leakage current of the capacitor and lowering capacitance.

Thus, notwithstanding these above-described methods of forming semiconductor capacitors, there still continues to be a need for improved method for semiconductor devices having a ruthenium layer and device for manufacturing the same.

SUMMARY OF THE INVENTION

A method for fabricating a semiconductor device is provided, which includes the steps of: forming a ruthenium layer on a semiconductor substrate in a processing chamber; forming a barrier layer on the ruthenium layer supplying a halide-free precursor in the processing chamber; and forming a metal layer on the barrier layer.

According to an embodiment of the present invention, the barrier layer is one of a TiN layer, a TaN layer, a WN layer, and an MoN layer. The barrier layer is formed by using one of a PVD process, an MOCVD process, and an ALD process. The TiN layer is formed by using one of an MOCVD process and an ALD process, and the halide-free precursor is a titanium compound selected from the group consisting of pentakis(diethylamino)titanium, tetrakis(diethylamino)titanium, tetrakis(dimethylamino)titanium, and pentakis(dimethylamino)titanium. The TaN layer is formed by using one of an MOCVD process and an ALD process, and the halide-free precursor is a tantalum compound selected from the group consisting of t-butyltrikis(diethylamino)tantalum, pentakis(diethylamino)tantalum, tetrakis(dimethylamino)tantalum, and pentakis(dimethylamino)tantalum. The halide-free precursor preferably includes a nitrogen containing gas.

According to an embodiment of the present invention, the method further includes the steps of: forming a planarized insulating layer on the ruthenium layer; and forming a contact hole to expose a portion of the ruthenium layer by etching a portion of the planarized insulating layer, wherein the barrier layer is formed on the exposed ruthenium layer in the contact hole. The metal layer is one of an aluminum layer, an aluminum alloy layer, a tungsten layer, and a copper layer.

A method for fabricating a semiconductor device is also provided, which includes the steps of: forming a ruthenium layer on a semiconductor substrate in a processing chamber; forming a conducting pad layer using a halide-free precursor in the processing chamber; forming a barrier layer on the conducting pad layer; and forming a metal layer on the barrier layer.

According to an embodiment of the present invention, the conducting pad layer is formed by using one of a PVD process, an MOCVD process, and an ALD process. The conducting pad layer is one of a Ti layer, a TiN layer, a Ta layer, and a TaN layer. The TiN layer is formed by using one of an MOCVD process and an ALD process, and the halide-free precursor is a titanium compound selected from the group consisting of pentakis(diethylamino)titanium, tetrakis(diethylamino)titanium, tetrakis(dimethylamino) titanium, and pentakis(dimethylamino)titanium. The Ta layer and the TaN layer are formed by using one of an MOCVD process and an ALD process, and the halide-free precursor is a tantalum compound selected from the group consisting of t-butyltrikis(diethylamino)tantalum, pentakis (diethylamino)tantalum, tetrakis(dimethylamino)tantalum, and pentakis(dimethylamino)tantalum. The Ti layer and the Ta layer are formed by using a PVD process. The halide-free precursor preferably includes a nitrogen containing gas. The barrier layer is formed by using a halide containing precursor by using a CVD process. The halide containing precursor is $TiCl_4$. The metal layer is one of an aluminum layer, an aluminum alloy layer, a tungsten layer, and a copper layer.

According to an embodiment of the present invention, the method further includes the steps of: forming a planarized insulating layer on the conducting pad layer; and forming a contact hole to expose a portion of the conducting pad layer by etching a portion of the planarized insulating layer, wherein the barrier layer is formed on the exposed conducting layer in the contact hole. The barrier layer is formed on an inner wall of the contact hole and a portion of the planerized insulating layer extended from the inner wall of the contact hole. The ruthenium layer is used as a capacitor upper electrode.

A semiconductor device is also provided, which includes: a ruthenium layer on a semiconductor substrate; a conducting pad layer formed by using a halide-free precursor on the ruthenium layer; a planarized insulating layer on the semiconductor substrate having the conducting pad layer, the planarized insulating layer having a contact hole to expose a portion of the conducting pad layer; a barrier layer formed at least on a bottom of the contact hole; and a metal layer formed on the barrier layer, an inner wall of the contact hole, and a portion of the insulating layer. According to an embodiment of the present invention, the barrier layer is formed on the inner wall of the contact hole and a portion of the insulating layer. The barrier layer is one of a TiN layer, a TaN layer, a WN layer, and an MoN layer. The conducting pad layer is one of a Ti layer, a TiN layer, a Ta layer, and a TaN layer.

BRIEF DESCRIPTION OF THE DRAWINGS

The above and other objects and advantages of the present invention will become more apparent by describing in detail preferred embodiments thereof with reference to the accompanying drawings in which.

DETAILED DESCRIPTION OF PREFERRED EMBODIMENTS

Hereinafter, embodiments of the present invention will be described in detail with reference to the attached drawings. However, the embodiments of the present invention may be modified into various other forms, and the scope of the present invention must not be interpreted as being restricted to the embodiments. The embodiments are provided to more completely explain the present invention to those skilled in the art. In drawings, the thicknesses of layers or regions are exaggerated for clarity. Like numbers refer to like elements throughout. Also, when it is written that a layer is formed "on" another layer or a substrate, the layer may be formed directly on the other layer or the substrate, or other layers may intervene therebetween.

Figure 1:
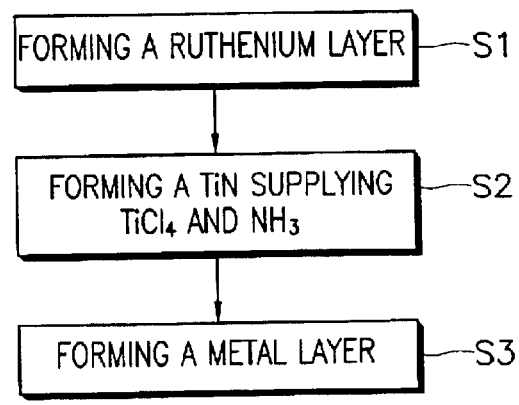
FIG. 1 is a flow chart of a conventional process for forming a barrier layer between a ruthenium layer and a metal layer.
Figure 2:
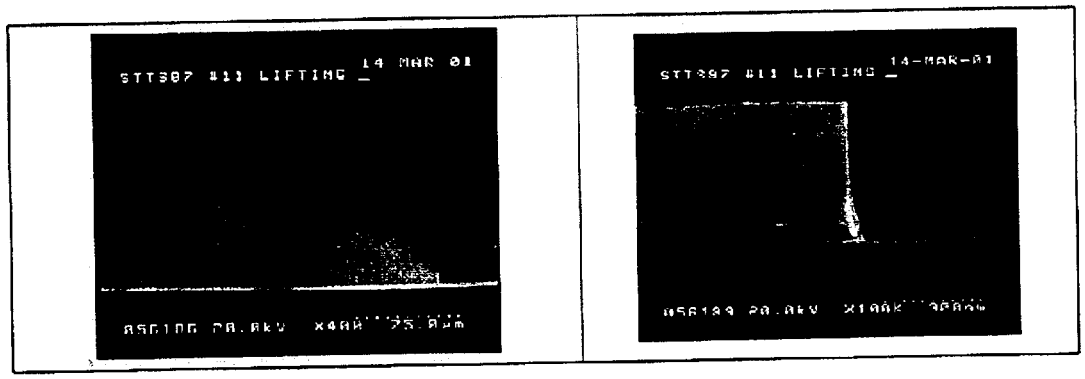
FIG. 2 is a scanning electron microphotograph (SEM) showing a cross-sectional view of a conventional structure having a barrier layer between a ruthenium layer and a metal layer.
Figure 3:
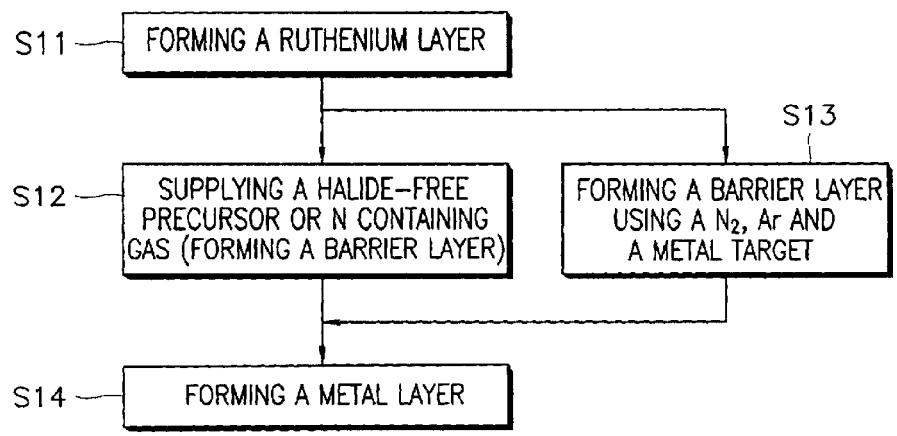
FIG. 3 is a flow chart of a process for forming a barrier layer between a ruthenium layer and a metal layer according to the present invention.

FIG. 3 shows a flow chart of a process for forming a barrier layer between a ruthenium layer and a metal layer according to an embodiment of the present invention. Referring to FIG. 3, a ruthenium layer is formed on a semiconductor substrate (not shown) in a chamber (not shown) [S11]. The ruthenium layer is formed by one of a physical vapor deposition (PVD) process, a chemical vapor deposition (CVD) process, and an atomic layer deposition (ALD) process.

Next, a barrier layer is formed on the ruthenium layer by one of an atomic layer deposition (ALD) process and a metal-organic CVD (MOCVD) by supplying a halide-free precursor and a nitrogen containing gas to the chamber [S12]. According to a preferred embodiment of the present invention, the barrier layer is a nitride barrier layer such as TiN, TaN, WN, MoN, or the like. The precursor for forming the TiN layer by one of the MOCVD and the ALD process is a titanium compound selected from the group consisting of pentakis(diethylamino)titanium, tetrakis(diethylamino) titanium, tetrakis(dimethylamino)titanium, and pentakis (dimethylamino)titanium. The precursor for forming the TaN layer by one of the MOCVD and the ALD process is a tantalum compound selected from the group consisting of t-butyltrikis(diethylamino)tantalum, pentakis(diethylamino) tantalum, tetrakis(dimethylamino)tantalum, and pentakis (dimethylamino)tantalum.

According to an embodiment of the present invention, the nitride barrier layer such as TiN or TaN layer can be also formed by a sputtering process, which is performed by supplying an Ar gas and a nitrogen gas to a sputtering chamber having a metal target such as Ti or Ta [S13].

Next, a metal layer is formed on the barrier layer [S14]. The metal layer can be a wire layer, and can be formed of one of aluminum, aluminum alloy, copper, and tungsten.

According to a preferred embodiment of the present invention, an adhesion layer is further formed on the ruthenium layer before forming the barrier layer. When the barrier layer is the TiN layer, a titanium layer is formed on the ruthenium layer by a PVD process. When the barrier layer is the TaN layer, a tantalum layer is formed on the ruthenium layer by one of a PVD process and an MOCVD process. A precursor for forming the tantalum layer by the MOCVD process can be used the same as the precursor for forming the TaN layer.

According to a preferred embodiment, as the precursor or the metal target for forming the barrier layer is a halide, such as Cl$^-$, Br$^-$, or F$^-$, free compound, there is no reaction between the halide and the ruthenium layer. That is, a barrier layer separation compound, for example, ruthenium halide gas such as RuCl$_3$(g) or ruthenium halide salt such as RuCl$_3$*H$_2$O cannot be formed, thereby preventing from deteriorating electrical and physical characteristics between the ruthenium layer and the metal layer.

Figure 4:
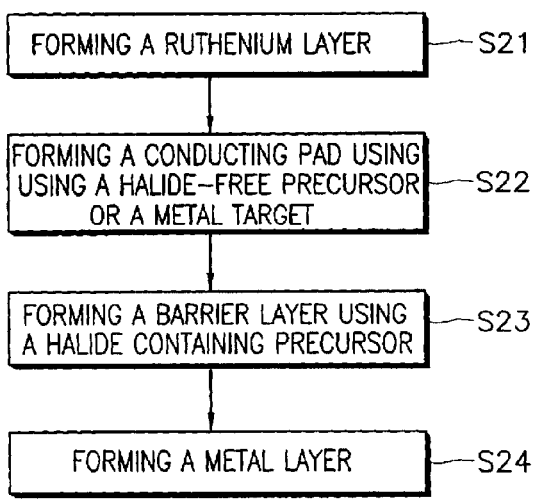
FIG. 4 is a flow chart of another process for forming a barrier layer between a ruthenium layer and a metal layer according to the present invention.

FIG. 4 shows a flow chart of another process for forming a barrier layer between a ruthenium layer and a metal layer according to the present invention. Referring to FIG. 4, the ruthenium layer is formed on a semiconductor substrate (not shown) in a chamber (not shown) [S21]. The ruthenium layer is formed by one of a physical vapor deposition (PVD) process, a chemical vapor deposition (CVD) process, and an atomic layer deposition (ALD) process.

Next, a conducting pad layer is formed on the ruthenium layer by one of an atomic layer deposition (ALD) process and a metal-organic CVD (MOCVD) supplying a halide-free precursor and/or reaction gas [S22]. Preferably, the conducting pad layer is formed of one of Ti, Ta, TiN, and TaN. The precursor for forming the conducting pad layer such as Ti or TiN by one of the MOCVD and the ALD process is a titanium compound selected from the group consisting of pentakis(diethylamino)titanium, tetrakis (diethylamino)titanium, tetrakis(dimethylamino)titanium, and pentakis(dimethylamino)titanium. According to an embodiment of the present invention, the conducting pad layer such as Ti, TiN, Ta, or TaN can be also formed by a sputtering process, which is performed by supplying an Ar gas and a reaction gas to a sputtering chamber (not shown) having a metal target such as Ti or Ta. The reaction gas is a nitrogen containing gas or a nitrogen-free gas.

Next, a barrier layer is formed on the conducting pad layer [S23]. That is, the barrier layer does not directly contact with the ruthenium layer. Thus, though the barrier layer is formed by one of a ALD process and a CVD process using a halide-containing reaction gas, the barrier layer is not separated from the conducting pad layer, and a ruthenium halide salt, for example, RuCl$_3$*H$_2$O, between the ruthenium layer and the barrier layer cannot be formed because the halide-containing reaction gas cannot react with the ruthenium layer. Alternatively, the barrier layer can be formed by an ALD process or an MOCVD process supplying a halide-free reaction gas, or a PVD process using a metal target.

Next, a metal layer is formed on the barrier layer [S24] using a similar process in S14 (in FIG. 3).

Figure 5:
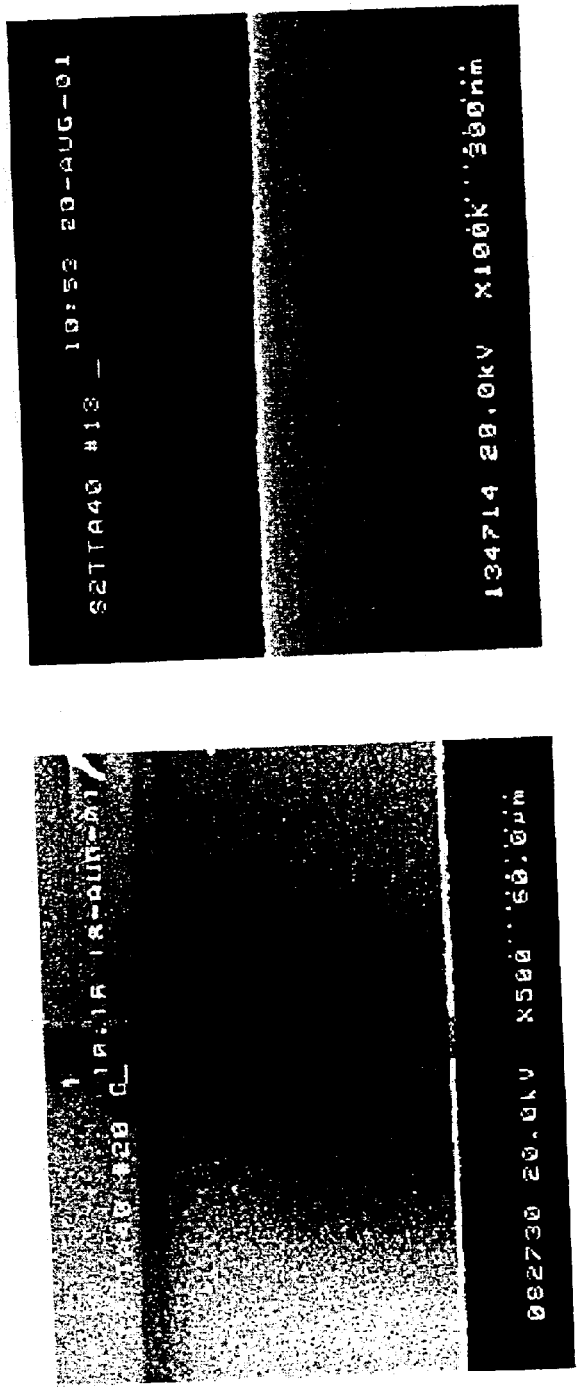
FIG. 5 is a SEM showing a cross-sectional view of structure having a barrier layer between a ruthenium layer and a metal layer according to the present invention.

FIG. 5 is a SEM showing a cross-sectional view of structure having a barrier layer between a ruthenium layer and a metal layer according to the present invention. For taking the SEM, a barrier layer was formed of a Ti/TiN on the ruthenium layer by a PVD process and consecutively formed of a Ti/TiN by a CVD process for recovering poor step coverage of the Ti/TiN by the PVD process. As shown in FIG. 5, the barrier layer is not separated from the ruthenium layer.

Figure 6A:
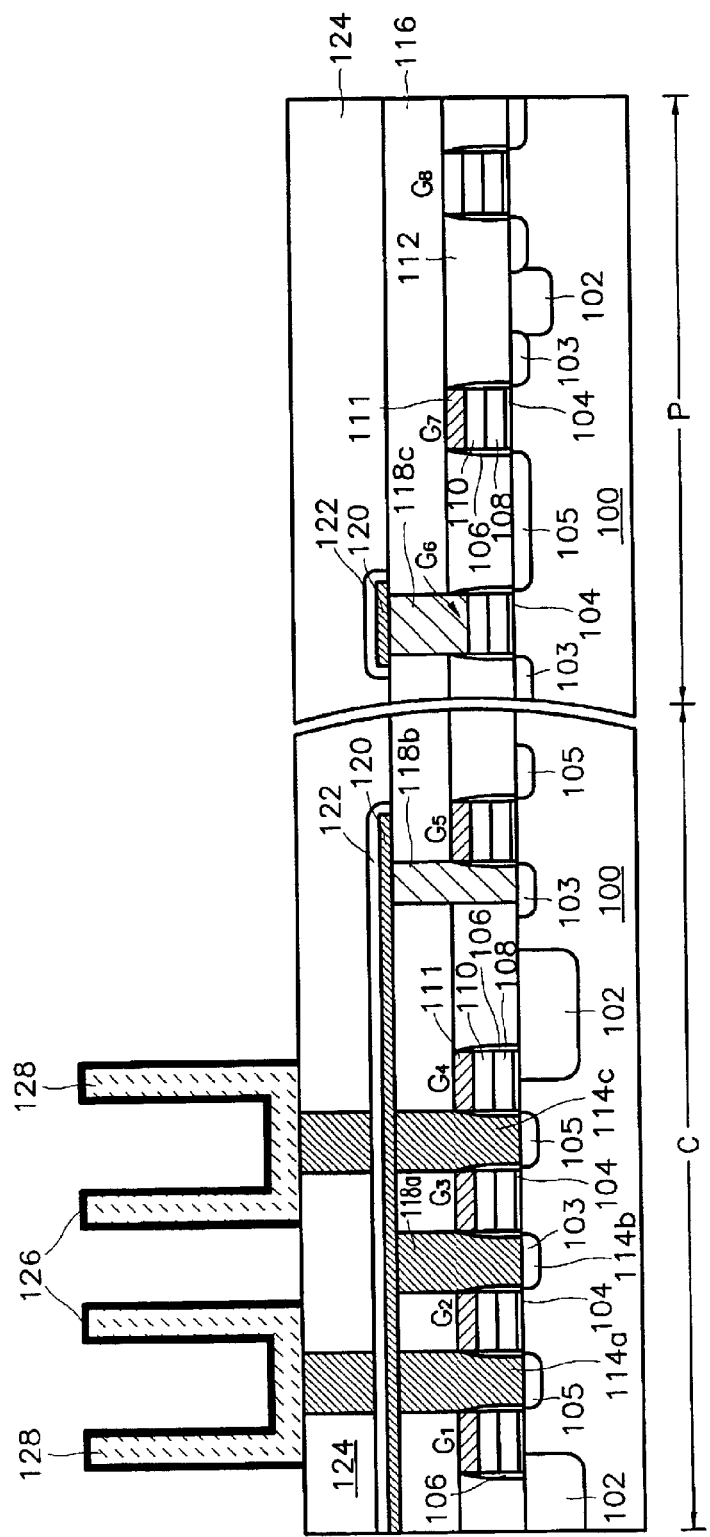
FIGS. 6A to 6C are cross-sectional views of structures illustrating a method of manufacturing process having a barrier layer between a capacitor upper electrode formed of ruthenium and a metal layer according to the present invention.
Figure 6B:
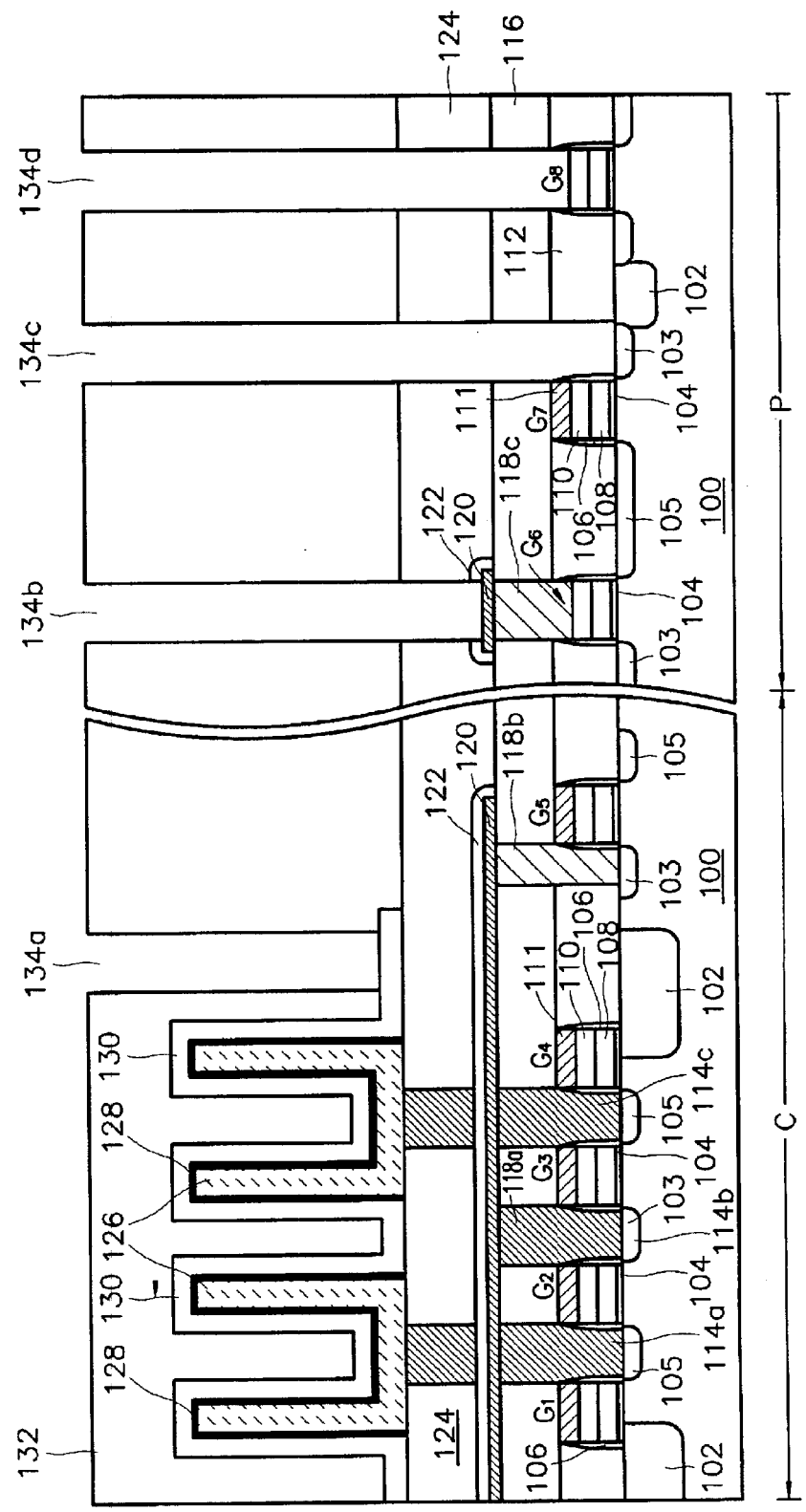
Figure 6C:
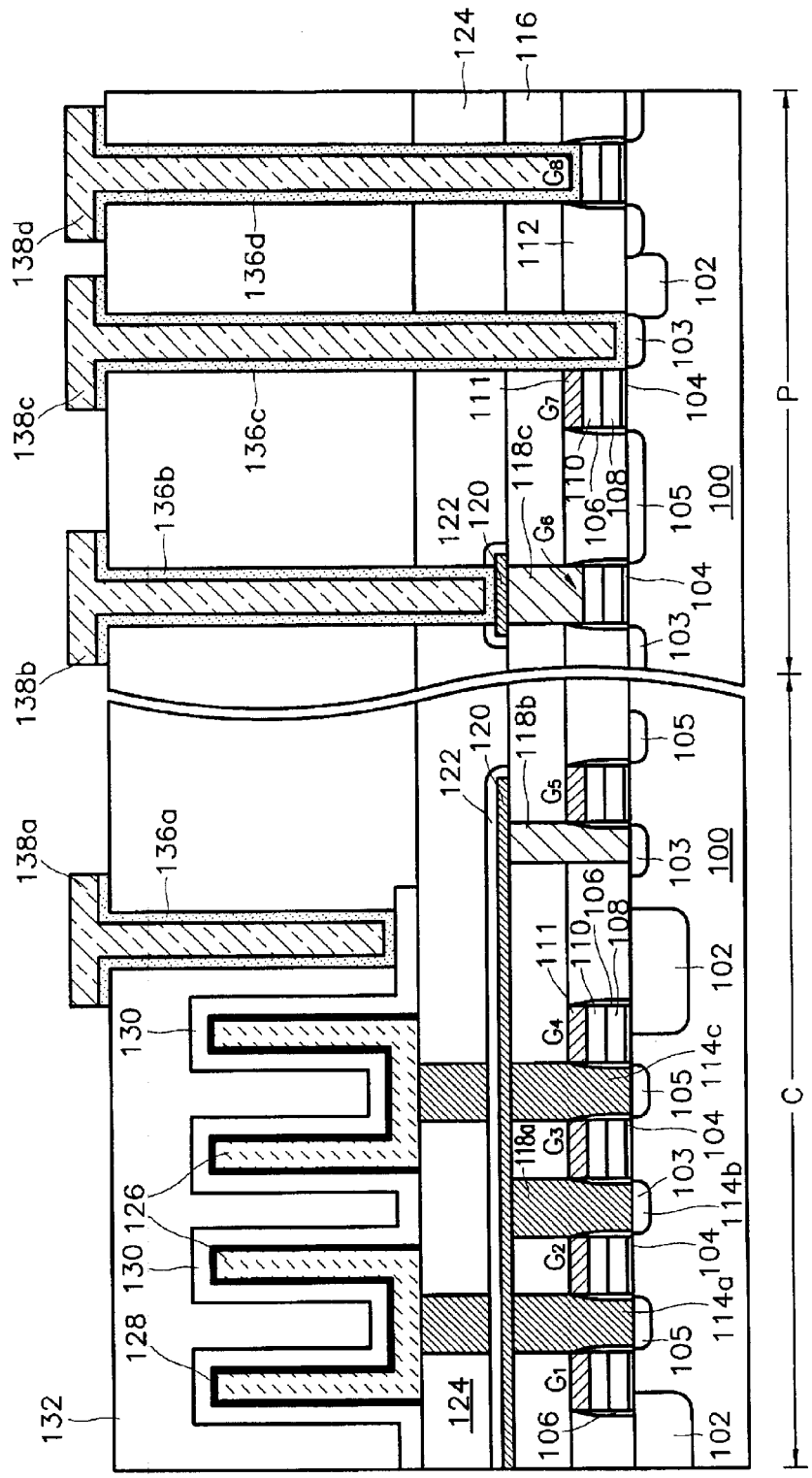

FIGS. 6A to 6C are cross-sectional views of structures illustrating a method of manufacturing process having a barrier layer between a capacitor upper electrode formed of ruthenium and a metal layer according to the present invention.

Referring to FIG. 6A, gates G1–G8 are formed on a semiconductor substrate 100 having a cell region C and a peripheral region P. Each of the gates G1–G8 is insulated by device separation layers 102, and each of the gates G1–G8 is formed of a gate insulating layer 104, a polysilicon layer 108, a metal silicide layer 110, and a capping layer 111 formed of a nitride layer. Spacers 106 are formed at both sides of lateral surface of the each of the gates G1–G8. Source/drain regions 103 and 105 are formed on the semiconductor substrate and between each of the gates G1–G8. The gates G1–G8 are covered with a first insulating layer 116, the first insulating layer 116 is planarized. A first plug 114b in contact with the source region 103 is formed in the first insulating layer 116 for connecting a bit line 120. The bit line 120 and a bit line capping layer 122 are sequentially formed on the first insulating layer 116.

In the peripheral region P, a second plug 118c is formed to connect to the metal silicide 110 of the gate G5 and the bit line 120. The bit line 120 and the bit line capping layer 122 are covered with a second insulating layer 124, storage electrode plugs 114a and 114c are formed in the insulating layer 116 and the second insulating layer 124 to connect with the drain 105.

A capacitor storage electrode 126 and a dielectric layer 128 are formed on the second insulating layer 124. According to an embodiment of the present invention, the capacitor storage electrode 126 is formed on the storage electrode plugs 114a and 114c by using one of a CVD process, an ALD process, and a PVD process. The capacitor storage electrode 126 can be formed of one of polysilicon layer and a metal layer such as ruthenium. The dielectric layer 128 can be formed of one of SiO$_2$, SiN$_3$, Ta$_2$O$_5$, and (Ba, Sr)TiO$_3$ (BST).

Referring to FIG. 6B, a capacitor upper electrode 130 is formed of ruthenium on the dielectric layer 128. After forming the capacitor upper electrode 130, a third insulating layer 132 is formed on a whole surface including the capacitor upper electrode 130. For forming the third insulating layer 132, first, an insulating material is covered to the cell region C having the capacitor upper electrode 130 and the peripheral region P, and then, the insulating material is planarized to form the third insulating layer 132 by one of a chemical mechanical polishing (CMP) process, spin on glass (SOG) curing process, and re-flow process. And first contact holes 134a, 134b, 134c, and 134d are formed by etching out predetermined portions to expose a portion of the capacitor upper electrode 130, the bit line 120 of the peripheral region P, the source region 103 of the peripheral region P, and the metal silicide layer 110 of the peripheral region P.

Referring to FIG. 6C, a barrier material layer (not shown) is formed on the third insulating layer 132 having the first contact holes 134a, 134b, 134c, and 134d. The barrier material layer is formed by one of an MOCVD process and an ALD process supplying a halide-free precursor and a nitrogen containing gas (S12 of FIG. 3), or formed by a sputtering process, which is performed by supplying an Ar gas and a nitrogen gas to a sputtering chamber having a metal target (S13 of FIG. 3). Preferably, the barrier material layer is formed by one of the MOCVD process and the ALD process.

According to an embodiment of the present invention, the barrier material layer is a nitride barrier layer such as TiN, TaN, WN, MoN, or the like. The halide-free precursor for forming the TiN layer by one of the MOCVD process and the ALD process is a titanium compound selected from the group consisting of pentakis(diethylamino)titanium, tetrakis(diethylamino)titanium, tetrakis(dimethylamino)titanium, and pentakis(dimethylamino)titanium. The halide-free precursor for forming the TaN layer by one of the MOCVD and the ALD process is a tantalum compound selected from the group consisting of t-butyltrikis(diethylamino)tantalum, pentakis(diethylamino)tantalum, tetrakis(dimethylamino)tantalum, and pentakis(dimethylamino)tantalum. Process conditions such as a temperature and a pressure of the process chamber can be controlled in accordance with types of the precursors, types and thickness of the barrier material layer to be formed.

Next, a wire material layer (not shown) is formed on the barrier layer as described in S14 of FIG. 3. The wire material layer is formed of one of aluminum, aluminum alloy, copper, and tungsten.

Then, the barrier material layer and the wire material layer is patterned to form first barrier layers 136a, 136b, 136c, and 136d and first wire layers 138a, 138b, 138c, and 138d According to an embodiment of the present invention, as the precursor for forming the barrier metal layer is a halide, such as Cl$^-$, Br$^-$, or F$^-$, free compound, ruthenium halide gas such as RuCl$_3$(g) or a ruthenium halide salt such as RuCl$_3$*H$_2$O cannot be formed. Thus, there is no gaps or insulating layers of a ruthenium halide salt between the capacitor upper electrode 130 and the first barrier layers 136a–136d, thereby preventing leakage current and from lowering capacitance.

Figure 7A:
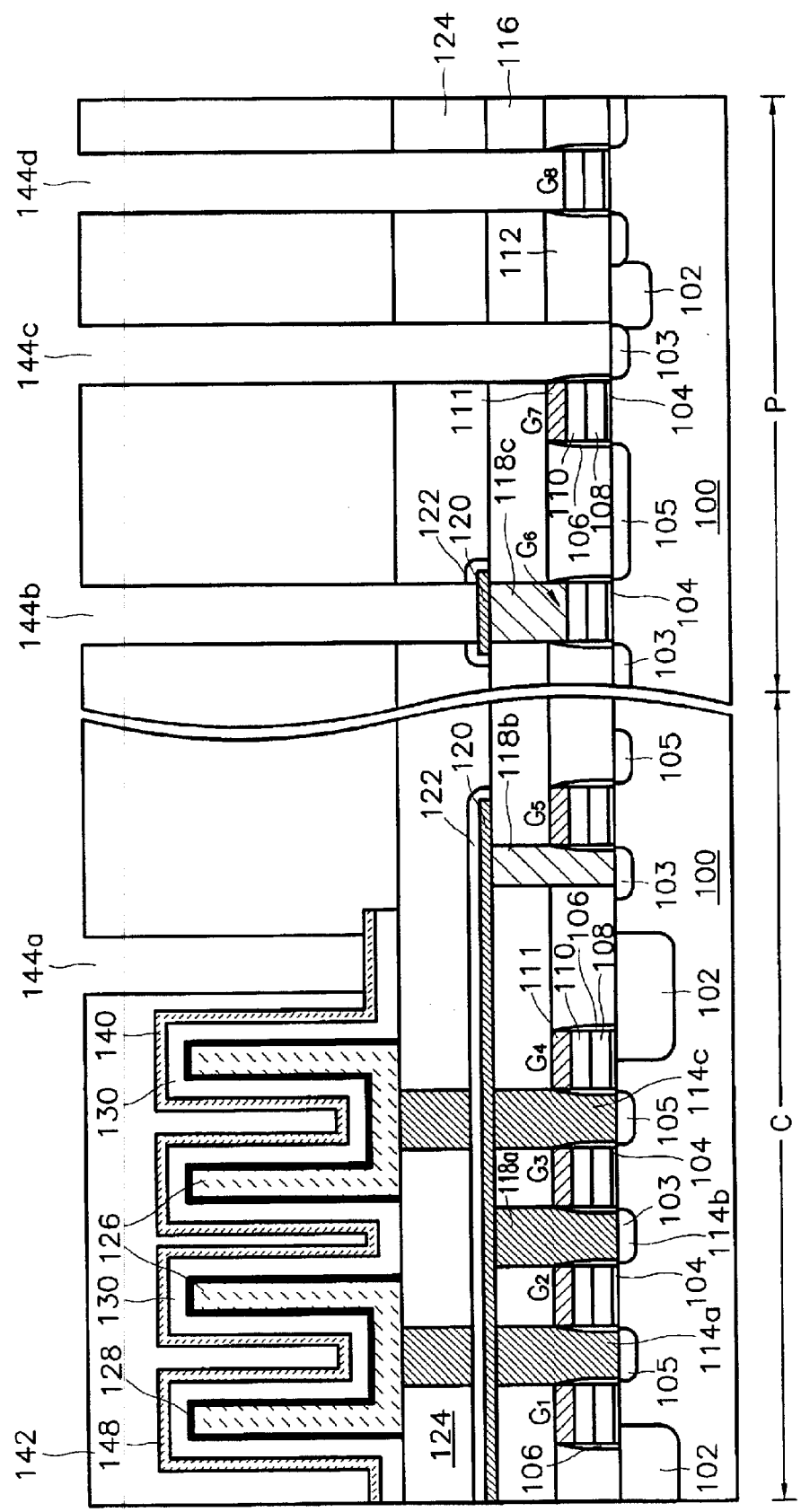
FIGS. 7A to 7B are another cross-sectional views of structures illustrating a method of manufacturing process having a barrier layer between a capacitor upper electrode formed of ruthenium and a metal layer according to the present invention.
Figure 7B:
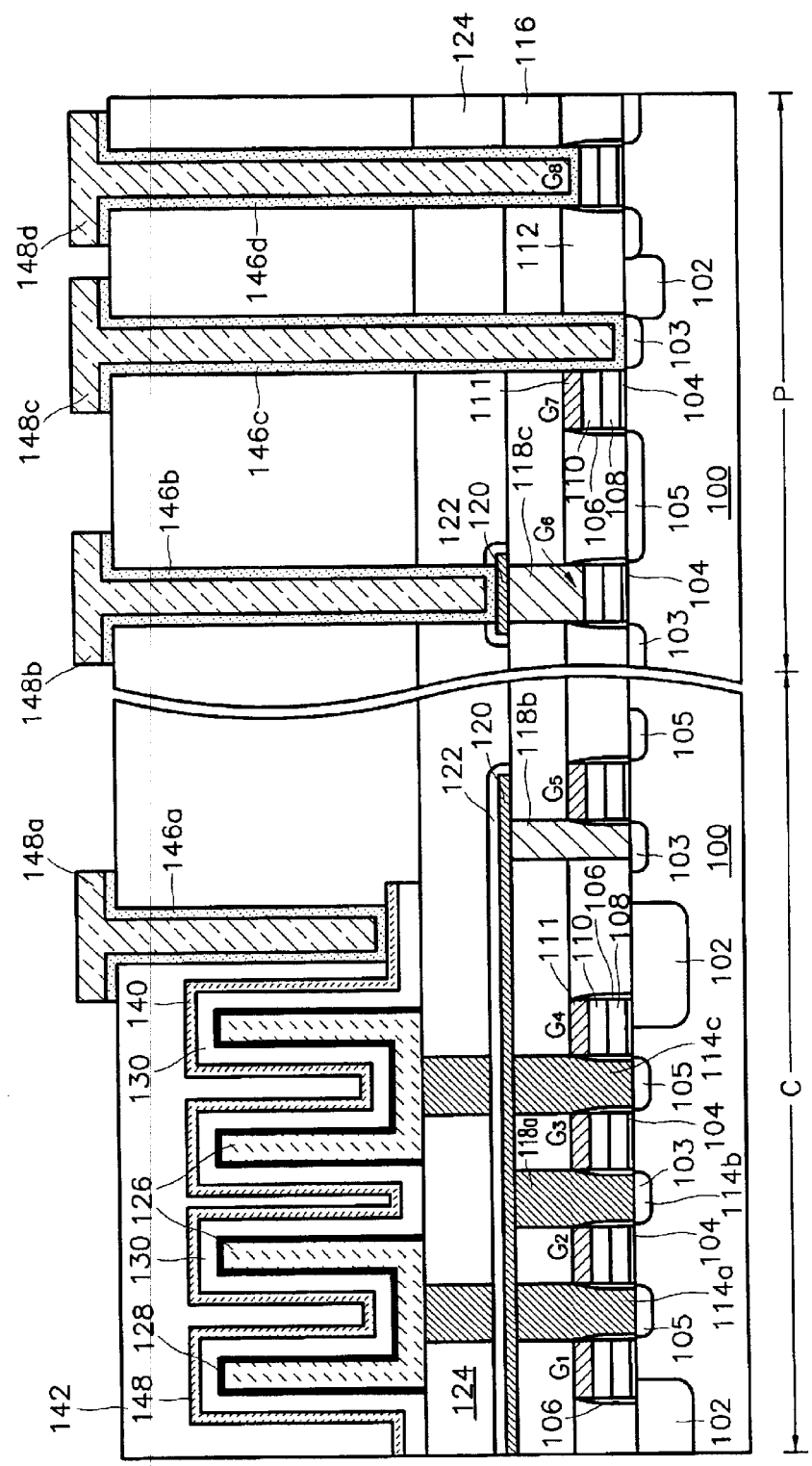

FIGS. 7A to 7B are another cross-sectional views of structures illustrating a method of manufacturing process having a barrier layer between a capacitor upper electrode formed of ruthenium and a metal layer according to the present invention.

Referring to FIG. 7A, the steps of forming a capacitor lower electrode and forming a dielectric layer are similar to the steps in FIG. 6A, and a capacitor upper electrode 130 is also formed as the explained process in FIG. 6A. Next, a conducting pad layer 140 is formed on the capacitor upper electrode 130. The conducting pad layer 140 is composed of material not to react with the ruthenium layer formed of the capacitor upper electrode 130. According to an embodiment of the present invention, the conducting pad layer 140 is formed by one of an ALD process and an MOCVD process using a halide-free reaction source, or formed by a PVD process using a metal target. Preferably, the conducting pad layer 140 is composed of a material having good adhesive strength to the capacitor upper electrode 130 and a barrier layer 146a (FIG. 7B) to be formed. According to an embodiment of the present invention, the conducting pad layer 140 is formed of one of Ti, TiN, Ta, and TaN. If a PVD process is used, Ti, TiN, Ta, and TaN can be formed, and if the MOCVD process is used, TiN, Ta, and TaN can be formed. According to an embodiment of the present invention, a precursor for forming the conducting pad layer 140 of the TiN by the MOCVD process is a titanium compound selected from the group consisting of pentakis(diethylamino)titanium, tetrakis(diethylamino)titanium, tetrakis(dimethylamino)titanium, and pentakis(dimethylamino)titanium. A precursor for forming the conducting pad layer 140 of Ta or TaN layer by one of the MOCVD and the ALD process is a tantalum compound selected from the group consisting of t-butyltrikis(diethylamino)tantalum, pentakis(diethylamino)tantalum, tetrakis(dimethylamino)tantalum, and pentakis(dimethylamino)tantalum.

Next, a fourth insulating layer 142 is formed on a whole surface having the conducting pad layer 140 and second contact holes 144a–144d are formed in the fourth insulating layer 142.

Referring to FIG. 7B, second barrier layers 146a–146d and second wire layers 148a–148d are formed in the second contact holes 144a–144d. According to an embodiment of the present invention, as the second barrier layers 146a–146d are not directly in contact with the capacitor upper electrode 130, the second barrier layers 146a–146d can be formed of a CVD process using a halide containing reaction source such as TiCl$_4$. Alternatively, the second barrier layers 146a–146d can be formed by using one of a halide-free precursor and a halide-free metal target.

As the conducting pad layer 140 is formed between the capacitor upper electrode 130 and the second wire layers 148a0148d, there are no gaps or insulating layers of a ruthenium halide salt between the capacitor upper electrode 130 and the second barrier layers 146a–146d, thereby preventing leakage current and lowered capacitance.

According to an embodiment of the present invention, a boding layer (not shown) such as Ti or Ta is further formed before forming the first barrier layer 136a–136d (FIG. 6B) and the second barrier layer 146a–146d (FIG. 7B). The bonding layer of Ti in FIG. 6B can be formed by a PVD process, the bonding layer of Ta in FIG. 6B can be formed by one of a PVD process and an MOCVD process. The bonding layer of Ti or Ta in FIG. 7B can be formed by one of CVD, MOCVD, PVD, and ALD processes using a halide containing source.

According to an embodiment of the present invention, while a conducting pad layer and a barrier layer are formed between a ruthenium layer and a upper electrode such as a metal layer, a ruthenium halide gas or a ruthenium halide salt is not formed, thereby preventing separation of the conducting pad layer and a barrier layer from the ruthenium layer and from deteriorating conduction characteristics between the ruthenium layer and the upper electrode. Preferably, decreasing capacitance or leakage current can be prevented when the ruthenium layer is used as a capacitor upper electrode.

Although the present invention has been described herein with reference to the accompanying drawings, it is to be understood that the present invention is not limited to those precise embodiments, and various other changes and modifications may be affected therein by one skilled in the art without departing from the scope or spirit. It will be apparent to one of ordinary skill in the art that modifications of the described embodiment may be made without departing from the spirit and scope of the invention. All such changes and modifications are intended to be included within the scope of the invention as defined by the appended claims.

What is claimed is:

1. A method for fabricating a semiconductor device, comprising the steps of:

forming a pillar-shaped electrode on a semiconductor substrate;

forming a conformal ruthenium layer on the pillar-shaped electrode;

depositing an insulating layer over the semiconductor substrate;

planarizing the insulating layer;

forming a contact hole to expose a portion of the conformal ruthenium layer by etching a portion of the planarized insulating layer;

forming a barrier layer on the exposed portion of the conformal ruthenium layer and sidewalls of the contact hole by supplying a halide-free precursor in the processing chamber; and forming a metal layer on the barrier layer.

2. The method of claim 1, wherein the barrier layer is one of a TiN layer, a TaN layer, a WN layer, and an MoN layer.

3. The method of claim 2, wherein the barrier layer is formed by using one of a PVD process, an MOCVD process, and an ALD process.

4. The method of claim 2, wherein the TiN layer is formed by using an ALD process, and the halide-free precursor is a titanium compound selected from the group consisting of pentakis(diethylamino) titanium, tetrakis(diethylamino) titanium, tetrakis(dimethylamino) titanium, and pentakis (dimethylamino) titanium.

5. The method of claim 2, wherein the TaN layer is formed by using one of an MOCVD process and an ALD process, and the halide-free precursor is a tantalum compound selected from the group consisting of t-butyltrikis (diethylamino) tantalum, pentakis(diethylamino)tantalum, tetrakis(dimethylamino)tantalum, and pentakis (dimethylamino)tantalum.

6. The method of claim 1, wherein the halide-free precursor comprises a nitrogen containing gas.

7. A method of claim 1, wherein the metal layer is one of an aluminum layer, an aluminum alloy layer, a tungsten layer, and a copper layer.

8. A method for fabricating a semiconductor device, comprising the steps of:

forming a pillar-shaped electrode on a semiconductor substrate;

forming a conformal ruthenium layer on the pillar-shaped electrode;

forming a conformal conducting pad layer on the conformal ruthenium layer using a halide-free precursor in the processing chamber;

depositing an insulating layer over the semiconductor substrate;

planarizing the insulating layer;

forming a contact hole to expose a portion of the conformal conducting pad layer;

forming a barrier layer on an exposed portion of the conformal conducting pad layer in the contact hole; and forming a metal layer on the barrier layer.

9. The method of claim 8, wherein the conducting pad layer is formed by using one of a PVD process, an MOCVD process, and an ALD process.

10. The method of claim 9, wherein the conducting pad layer is one of a Ti layer, a TiN layer, a Ta layer, and a TaN layer.

11. The method of claim 10, wherein the TiN layer is formed by using an ALD process, and the halide-free precursor is a titanium compound selected from the group consisting of pentakis(diethylamino)titanium, tetrakis (diethylamino)titanium, tetrakis(dimethylamino)titanium, and pentakis(dimethylamino)titanium.

12. The method of claim 10, wherein the Ta layer and the TaN layer are formed by using one of an MOCVD process and an ALD process, and the halide-free precursor is a tantalum compound selected from the group consisting of t-butyltrikis(diethylamino)tantalum, pentakis(diethylamino) tantalum, tetrakis(dimethylamino)tantalum, and pentakis (dimethylamino)tantalum.

13. The method of claim 10, wherein the Ti layer and the Ta layer are formed by using a PVD process.

14. The method of claim 8, wherein the halide-free precursor comprises a nitrogen containing gas.

15. A method of claim 8, wherein the metal layer is one of an aluminum layer, an aluminum alloy layer, a tungsten layer, and a copper layer.

16. The method of claim 8, wherein the contact hole is formed by etching a portion of the planarized insulating layer.

17. The method of claim 16, wherein the barrier layer is formed on an inner wall of the contact hole and a portion of a top surface of the planerized insulating layer extended from the inner wall of the contact hole.

18. The method of claim 17, wherein the conformal ruthenium layer is used as a capacitor upper electrode.

19. The method of claim 2, wherein the TiN layer is formed by using an MOCVD process and the halide-free precursor is a titanium compound selected from the group consisting of pentakis(diethylamino)titanium, and pentakis (dimethylamino)titanium.

20. The method of claim 10, wherein the TiN layer is formed by using an MOCVD process and the halide-free precursor is a titanium compound selected from the group consisting of pentakis(diethylamino)titanium, and pentakis (dimethylamino)titanium.

* * * * *